(12) United States Patent
Park et al.

(10) Patent No.: US 12,218,115 B2
(45) Date of Patent: Feb. 4, 2025

(54) DISPLAY DEVICE

(71) Applicant: Samsung Display Co., LTD., Yongin-si (KR)

(72) Inventors: Young Min Park, Yongin-si (KR); Hyuk Hwan Kim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 407 days.

(21) Appl. No.: 17/575,099

(22) Filed: Jan. 13, 2022

(65) Prior Publication Data
US 2022/0415869 A1 Dec. 29, 2022

(30) Foreign Application Priority Data
Jun. 23, 2021 (KR) .................. 10-2021-0081626

(51) Int. Cl.
*H01L 25/16* (2023.01)
*H10K 50/858* (2023.01)
*H10K 50/86* (2023.01)
*H10K 59/122* (2023.01)

(52) U.S. Cl.
CPC ......... *H01L 25/167* (2013.01); *H10K 50/858* (2023.02); *H10K 50/865* (2023.02); *H10K 59/122* (2023.02)

(58) Field of Classification Search
CPC ... H01L 25/167; H01L 33/44; H01L 25/0753; H01L 27/3272; H01L 27/32; H10K 50/865; H10K 59/122; H10K 59/879; H10K 59/8792; H10K 59/126; G02F 1/136204; G02F 2202/22; G02B 1/16
See application file for complete search history.

(56) References Cited

U.S. PATENT DOCUMENTS

| | | |
|---|---|---|
| 8,426,749 B2 | 4/2013 | Saneto et al. |
| 9,696,835 B2 | 7/2017 | Her |
| 10,770,515 B2 | 9/2020 | Kim et al. |
| 10,916,722 B2 | 2/2021 | Park et al. |
| 10,930,231 B2 | 2/2021 | Kim et al. |
| 11,038,151 B2 | 6/2021 | Ju et al. |
| 2006/0103285 A1 | 5/2006 | Lee |
| 2007/0090754 A1* | 4/2007 | Li ................. H10K 50/865 313/506 |
| 2014/0285729 A1* | 9/2014 | Lou ................. G06F 3/0412 349/12 |

(Continued)

FOREIGN PATENT DOCUMENTS

| | | |
|---|---|---|
| JP | 2008-306177 | 12/2008 |
| KR | 10-2018-0073194 | 7/2018 |

(Continued)

Primary Examiner — Brian Turner
Assistant Examiner — Nicholas B Michaud
(74) Attorney, Agent, or Firm — KILE PARK REED & HOUTTEMAN PLLC

(57) ABSTRACT

A display device includes a display element part disposed on a substrate, the display element part including a light emitting element, and an upper film layer disposed on the display element part, the upper film layer including an anti-electrostatic pattern. The anti-electrostatic pattern includes a conductive pattern and an anti-reflection pattern, and the conductive pattern and the anti-reflection pattern overlap each other.

21 Claims, 13 Drawing Sheets

(56) References Cited

U.S. PATENT DOCUMENTS

| | | | | |
|---|---|---|---|---|
| 2015/0049409 A1* | 2/2015 | Choi | ............... | H05K 9/0079 |
| | | | | 361/220 |
| 2016/0004340 A1* | 1/2016 | Kim | ............... | G06F 3/0443 |
| | | | | 345/173 |
| 2019/0035871 A1 | 1/2019 | Qian et al. | | |
| 2020/0075814 A1 | 3/2020 | Park et al. | | |
| 2020/0168668 A1* | 5/2020 | Kim | ............... | H10K 59/38 |
| 2023/0174826 A1* | 6/2023 | Pang | ............... | C09J 7/385 |
| | | | | 359/507 |

FOREIGN PATENT DOCUMENTS

| | | |
|---|---|---|
| KR | 10-2020-0032294 | 3/2020 |
| KR | 10-2020-0037760 | 4/2020 |
| KR | 10-2020-0092533 | 8/2020 |
| KR | 10-2180807 | 11/2020 |

* cited by examiner

FIG. 3
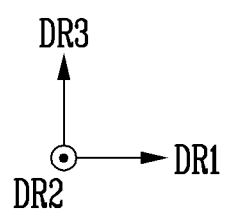

DISPLAY DEVICE

CROSS-REFERENCE TO RELATED APPLICATION(S)

This application claims priority to and benefits of Korean patent application 10-2021-0081626 under 35 U.S.C. § 119(a), filed on Jun. 23, 2021 in the Korean Intellectual Property Office, the entire contents of which are incorporated herein by reference.

BACKGROUND

1. Technical Field

The disclosure generally relates to a display device.

2. Discussion of Related Art

As interest in information displays increases, research and development of display devices continues.

SUMMARY

Embodiments provide a display device having improved electrical reliability by preventing an electrostatic phenomenon, and having improved visibility by reducing influence of external light.

In accordance with an aspect of the disclosure, there is provided a display device that may include a display element part disposed on a substrate, the display element part including a light emitting element, and an upper film layer disposed on the display element part, the upper film layer including an anti-electrostatic pattern, wherein the anti-electrostatic pattern includes a conductive pattern and an anti-reflection pattern, and the conductive pattern and the anti-reflection pattern overlap each other.

The upper film layer may include an outer film, and the anti-electrostatic pattern may be disposed on the outer film.

The outer film may include an anti-reflective coating.

The display device may further include a display area from which light may be emitted, and a non-display area surrounding at least a portion of the display area. The anti-electrostatic pattern may be electrically connected to a connection line disposed in the non-display area such that an electrostatic signal may be moved to outside of the display area and the non-display area.

The anti-electrostatic pattern may have a periodically patterned pattern.

The anti-electrostatic pattern may include a first anti-electrostatic pattern extending in a first direction, and a second anti-electrostatic pattern extending in a second direction intersecting the first direction. A unit shape provided by the first anti-electrostatic pattern and the second anti-electrostatic pattern intersecting each other may be a rectangular shape.

The anti-electrostatic pattern may be disposed in a mesh pattern having a rhombic unit shape.

The anti-electrostatic pattern may be disposed in a mesh pattern having a triangular unit shape.

The conductive pattern may include at least one of silver (Ag), copper (Cu), nickel (Ni), and gold (Au).

The anti-reflection pattern may include at least one of graphite, carbon black, black pigment, and black dye.

The anti-reflection pattern may have a reflexibility of less than about 30%.

The anti-electrostatic pattern may have a line width of less than about 10 μm.

The conductive pattern and the anti-reflection pattern may have a same shape in a plan view.

The outer film may be disposed on a surface of the anti-reflection pattern, and the conductive pattern may be disposed on another surface of the anti-reflection pattern.

The outer film may be disposed on a surface of the conductive pattern, and the anti-reflection pattern may be disposed on another surface of the conductive pattern.

The anti-reflection pattern may include a first anti-reflection pattern and a second anti-reflection pattern. The first anti-reflection pattern may be disposed between the outer film and the conductive pattern, the second anti-reflection pattern may be disposed on a surface of the conductive pattern, and the first anti-reflection pattern may not be disposed on the surface of the conductive pattern.

The display device may further include a light control part disposed between the display element part and the upper film, the light control part including a wavelength conversion layer that changes a wavelength of light.

The light emitting element may be at least one of an organic light emitting diode, a micro light emitting diode, and an inorganic light emitting diode.

In accordance with another aspect of the disclosure, there is provided a display device that may include a display element part disposed on a substrate, and an anti-electrostatic pattern disposed in a mesh pattern on the display element part, the anti-electrostatic pattern including a conductive pattern, and an anti-reflection pattern having a surface in contact with the conductive pattern, wherein the anti-reflection pattern has a reflexibility of less than about 30%.

The anti-electrostatic pattern may discharge an electrostatic signal against the display device.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 3 is a schematic sectional view illustrating a display device in accordance with an embodiment of the disclosure.

DETAILED DESCRIPTION OF THE EMBODIMENTS

Figure 1:
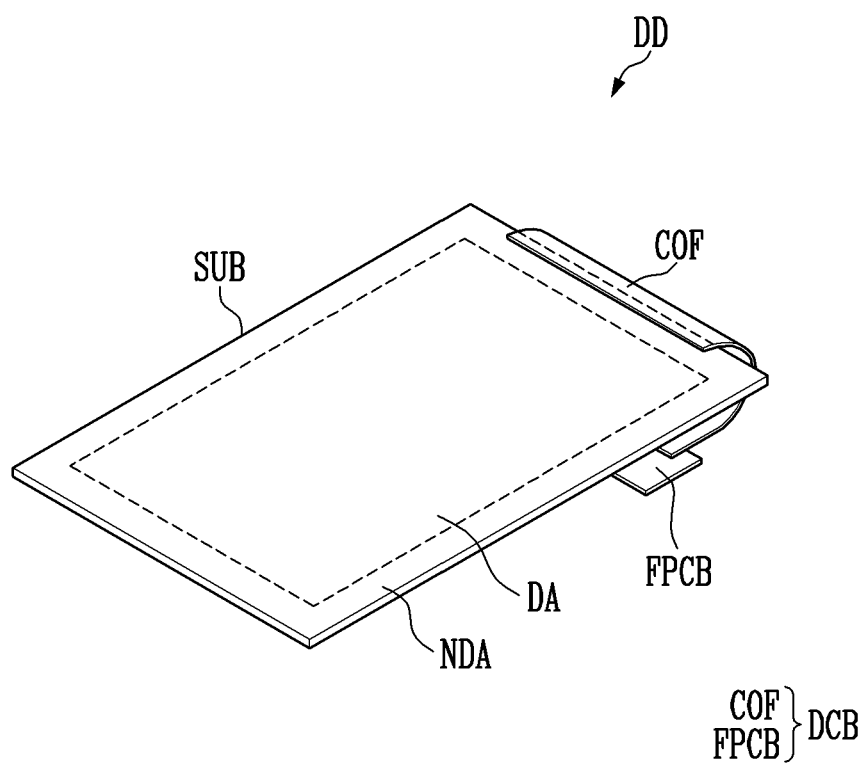
FIG. 1 is a schematic perspective view illustrating a display device in accordance with an embodiment of the disclosure.

Embodiments disclosed in the specification are provided only for illustrative purposes and for full understanding of the scope of the disclosure by those skilled in the art. However, the disclosure is not limited to the embodiments, and it should be understood that the disclosure includes modification examples or change examples without departing from the spirit and scope of the disclosure.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The drawings attached to the specification are provided to clearly explain the disclosure, and the shapes shown in the drawings may be exaggerated and displayed as necessary to aid understanding of the disclosure, and thus the disclosure is not limited to the drawings.

In the specification, when it is determined that a detailed description of a configuration or function related to the disclosure may obscure the gist of the disclosure, a detailed description thereof will be omitted as necessary.

When an element is referred to as being "in contact" or "contacted" or the like to another element, the element may be in "electrical contact" or in "physical contact" with another element. The element may be in "indirect contact" or in "direct contact" with another element.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The term "overlap" may include layer, stack, face or facing, extending over, covering or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The disclosure generally relates to a display device. Hereinafter, a display device in accordance with embodiments of the disclosure will be described with reference to FIGS. 1 to 13.

Figure 2:
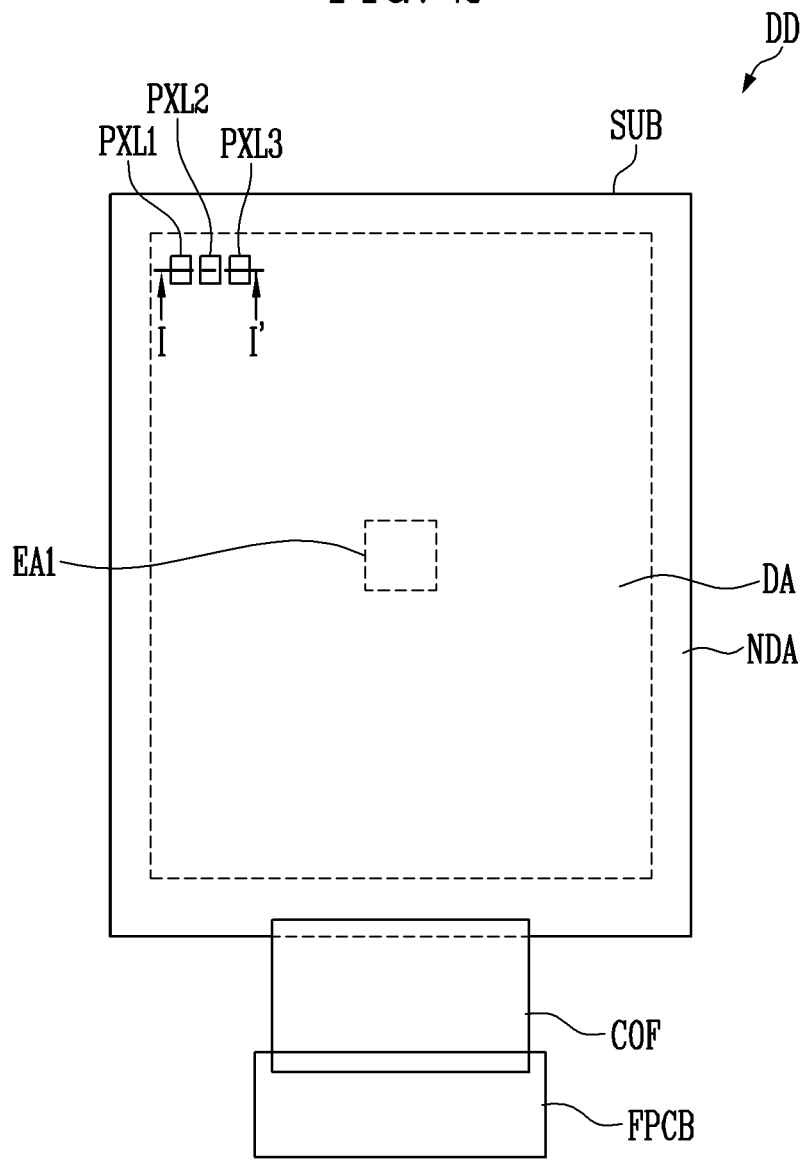
FIG. 2 is a schematic plan view illustrating a display device in accordance with an embodiment of the disclosure.

FIG. 1 is a schematic perspective view illustrating a display device in accordance with an embodiment of the disclosure. FIG. 2 is a schematic plan view illustrating a display device in accordance with an embodiment of the disclosure.

A display device DD may emit light. In an example, the display device DD may be a smartphone, a tablet personal computer (PC), a large screen device, a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device. However, the disclosure is not limited thereto.

Referring to FIGS. 1 and 2, the display device DD may include a substrate SUB, pixels PXL disposed on the substrate SUB, and a driving circuit board DCB.

The display device DD may include a display area DA and a non-display area NDA. The non-display area NDA may mean an area except the display area DA. The non-display area NDA may surround at least a portion of the display area DA.

The substrate SUB may constitute a base member of the display device DD. The substrate SUB may be a rigid or flexible substrate or film, but the disclosure is not limited to a specific example.

The display area DA may mean an area in which the pixels PXL may be disposed. The non-display area NDA may mean an area in which the pixels PXL may not be disposed. Lines and pads, which may be connected to the pixels PXL of the display area DA, may be disposed in the non-display area NDA.

In an example, the pixels PXL may be arranged in a stripe arrangement structure, a PENTILE™ arrangement structure, or the like. However, the disclosure is not limited thereto, and various arrangement structures may be applied.

A pixel PXL may include a light emitting element (see 'LD' shown in FIG. 4) that emits light. In an example, the light emitting element LD may be at least one of an organic light emitting diode, a micro light emitting diode, and an inorganic light emitting diode. However, the kind of light emitting element LD is not limited to a specific example.

In accordance with an embodiment, the pixel PXL may include a first pixel PXL1, a second pixel PXL2, and a third pixel PXL3. Each of the first to third pixels PXL1, PXL2, and PXL3 may be a sub-pixel. At least one first pixel PXL1, at least one second pixel PXL2, and at least one third pixel PXL3 may constitute one pixel unit capable of emitting light of various colors.

For example, each of the first to third pixels PXL1, PXL2, and PXL3 may emit light of a color. In an example, the first pixel PXL1 may be a red pixel emitting red light (e.g., a first color), the second pixel PXL2 may be a green pixel emitting green light (e.g., a second color), and the third pixel PXL3 may be a blue pixel emitting blue light (e.g., a third color). However, the colors, kind, and/or number of first to third pixels PXL1, PXL2, and PXL3 constituting each pixel unit are not limited to a specific example.

The driving circuit board DCB may include a chip on film COF and a flexible circuit board FPCB.

The chip on film COF may receive an electrical signal provided from the flexible circuit board FPCB. The chip on film COF may provide the electrical signal to the pixel PXL through a line.

An end of the chip on film COF may be connected to the substrate SUB, and another end of the chip on film COF may be connected to the flexible circuit board FPCB. In an example, at least a portion of the chip on film COF may be curved.

The chip on chip COF may include an insulating film and lines provided on the insulating film. Chip on film COF generally refers to a form in which lines may be formed on an insulating film configured as a thin film, and may be designated as a tape carrier package, a flexible printed circuit board, or the like. In the chip on film COF, although not shown in the drawings, a semiconductor chip connected to at least some of the lines may be further mounted on the insulating film.

A circuit element that processes the electrical signal provided to the pixel PXL may be disposed on the flexible circuit board FPCB.

The flexible circuit board FPCB may be disposed on a surface or a back surface of the substrate SUB. For example, an end portion of the flexible circuit board FPCB may be connected to the chip on film COF having a curved shape to be disposed on the back surface of the substrate SUB, and accordingly, the flexible circuit board FPCB may not be viewed from the outside (e.g., of the display device).

FIG. 3 is a schematic sectional view illustrating a display device in accordance with an embodiment of the disclosure.

In accordance with an embodiment, the display device DD may include a substrate SUB, a pixel circuit part PCL, a display element part DPL, a light control part LCP, and an upper film layer UFL.

In an example, the substrate SUB, the pixel circuit part PCL, the display element part DPL, the light control part LCP, and the upper film layer UFL may be sequentially stacked on each other along a display direction of the display device DD (e.g., a third direction DR3). The display direction may mean a thickness direction of the substrate SUB. However, the disclosure is not limited to the above-described example. In some embodiments, at least some of individual components may be disposed in the same layer.

The substrate SUB may constitute a base surface of the display device DD. The individual components of the display device DD may be disposed on the substrate SUB.

The pixel circuit part PCL may be disposed on the substrate SUB. The pixel circuit part PCL may include a transistor (see 'TR' shown in FIG. 4) that drives the pixel PXL.

The display element part DPL may be disposed on the pixel circuit part PCL. The display element part DPL may emit light, based on an electrical signal provided from the pixel circuit part PCL. The display element part DPL may include a light emitting element LD capable of emitting light. The light emitted from the display element part DPL may pass through the light control part LCP and the upper film layer UFL and then to the outside.

The light control part LCP may be disposed on the display element part DPL. The light control part LCP may be disposed over light emitting elements LD. However, the disclosure is not limited thereto. In some embodiments, a partial configuration of the light control part LCP and the display element part DPL may be disposed in a same layer.

Figure 6:
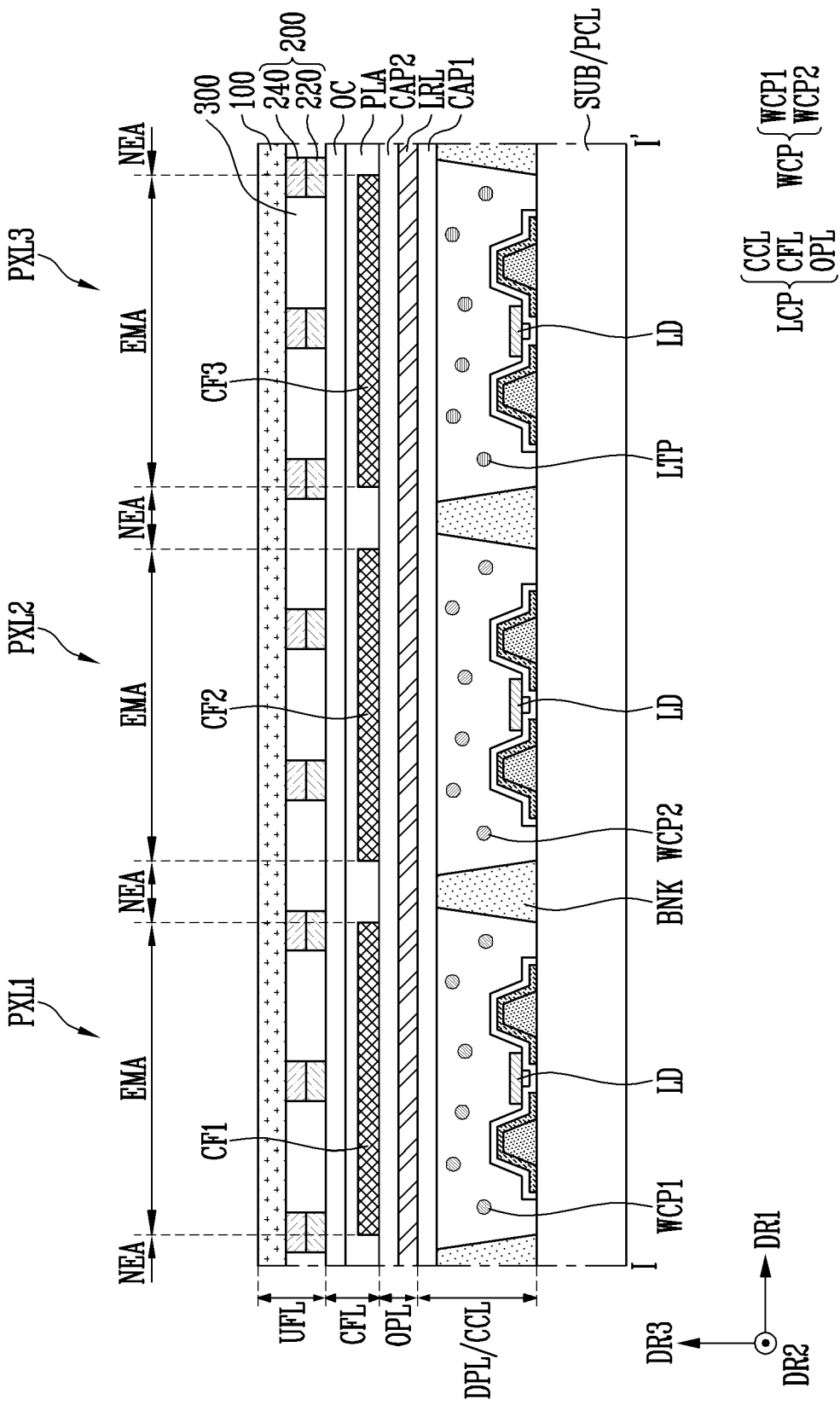
FIG. 6 is a schematic view illustrating a structure of a pixel in accordance with an embodiment of the disclosure, and is a sectional view illustrating a section taken along line I-I' shown in FIG. 2.

In accordance with an embodiment, the light control part LCP may change a wavelength of light provided from the display element part DPL (or the light emitting elements LD). In an example, as shown in FIG. 6, the light control part LCP may include a color conversion layer CCL that changes a wavelength of light and a color filter layer CFL which allows light having a specific wavelength to be transmitted therethrough. In some embodiments, the light control part LCP may further include an optical layer OPL for improving light efficiency.

The upper film layer UFL may be disposed on the light control part LCP. The upper film layer UFL may be adjacent to an outer surface of the display device DD. The upper film layer UFL may protect the display device DD from external influence. In an example, the upper film layer UFL may include an anti-electrostatic pattern (see '200' shown in FIG. 6), so that Electro-Static Discharge (ESD) which may occur adjacent to the display device DD can be prevented.

Hereinafter, a sectional structure of a pixel PXL in accordance with an embodiment of the disclosure will be described with reference to FIGS. 4 to 7. Descriptions of portions overlapping the above-described portions will be simplified or omitted.

Figure 4:
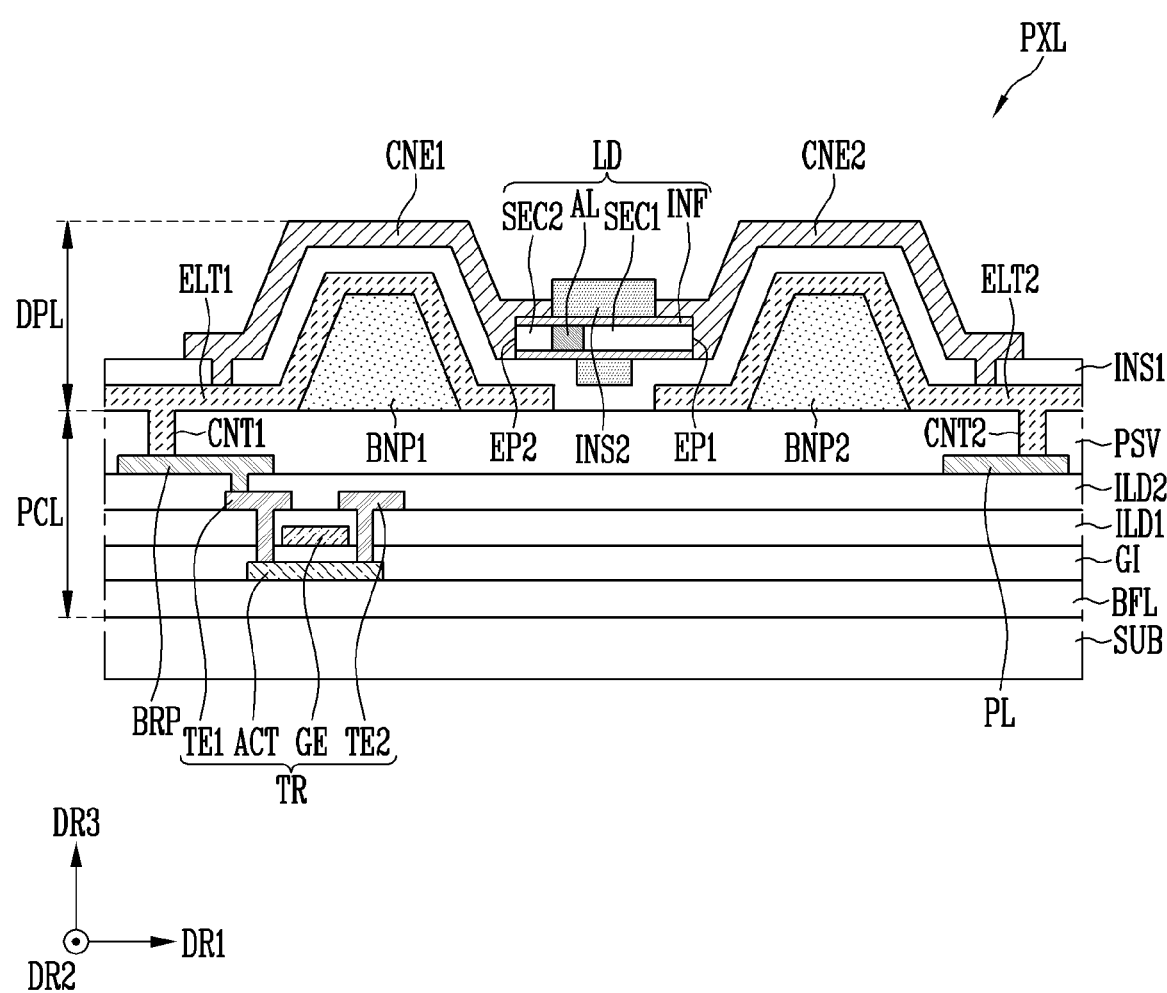
FIG. 4 is a schematic sectional view of a pixel in accordance with an embodiment of the disclosure.
Figure 5:
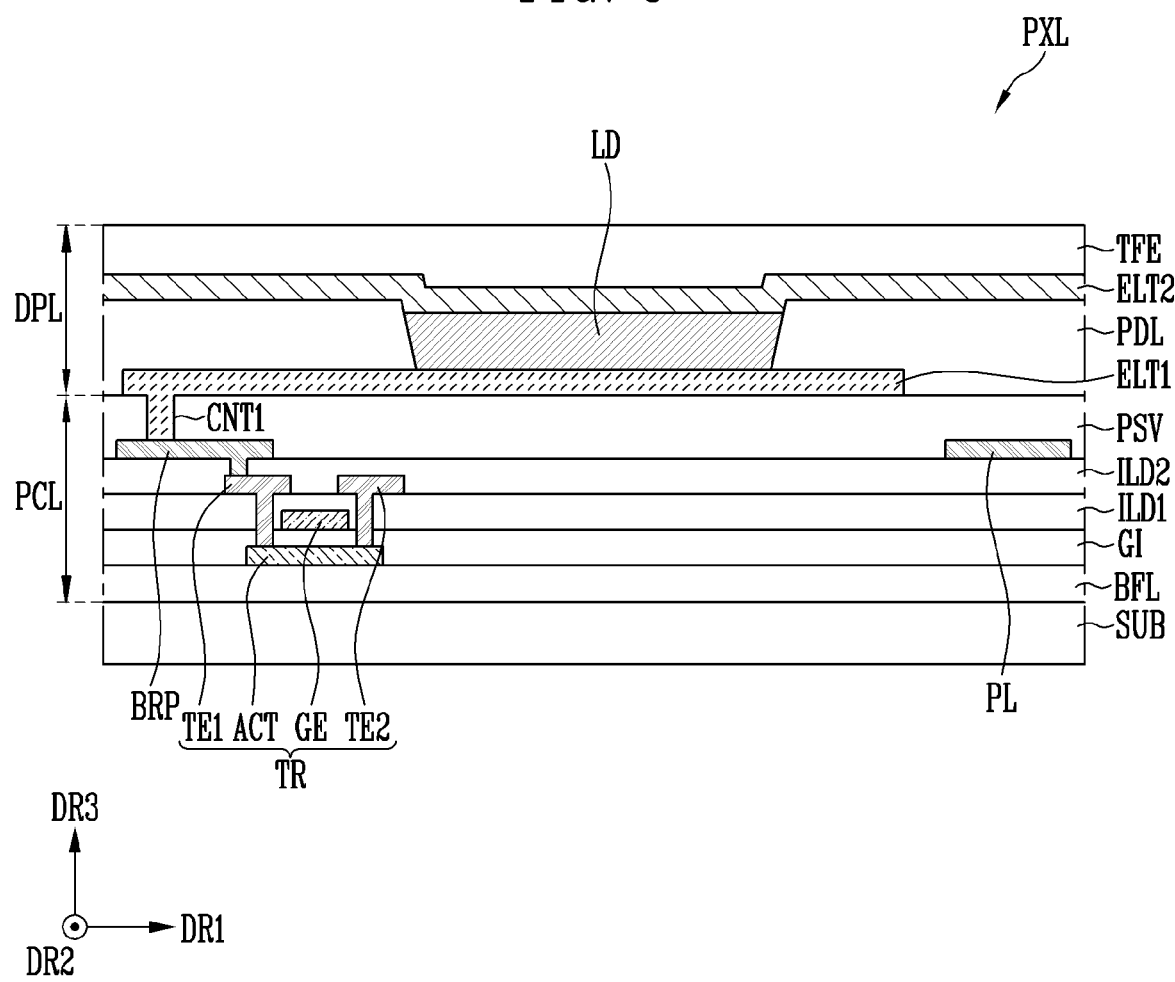
FIG. 5 is a schematic sectional view of a pixel in accordance with another embodiment of the disclosure.

A pixel circuit part PCL and a display element part DPL are illustrated in FIGS. 4 and 5, and a display element part DPL, a light control part LCP, and an upper film layer UFL are illustrated in FIG. 6.

First, a sectional structure of a pixel PXL in accordance with an embodiment of the disclosure will be described with reference to FIG. 4. FIG. 4 is a schematic sectional view of a pixel in accordance with an embodiment of the disclosure.

Referring to FIG. 4, the pixel PXL may include a substrate SUB, a pixel circuit part PCL, and a display element part DPL.

The substrate SUB may be provided as a base surface, and the pixel circuit part PCL and the display element part DPL may be disposed on the substrate SUB.

The pixel circuit part PCL may be disposed on the substrate SUB. The pixel circuit part PCL may include a buffer layer BFL, a gate insulating layer GI, a first interlayer insulating layer ILD1, a second interlayer insulating layer ILD2, a bridge pattern BRP, a power line PL, a protective layer PSV, a first contact part CNT1, and a second contact part CNT2.

The buffer layer BFL may be located (disposed) on the substrate SUB. The buffer layer BFL may prevent an impurity from being diffused from the outside. The buffer layer BFL may include at least one of silicon nitride ($SiN_x$), silicon oxide ($SiO_x$), silicon oxynitride ($SiO_xN_y$), and metal oxide such as aluminum oxide ($AlO_x$).

The transistor TR may be a thin film transistor. In accordance with an embodiment, the transistor TR may be a driving transistor.

The transistor TR may be electrically connected to a light emitting element LD. The transistor TR may be electrically connected to the bridge pattern BRP.

The transistor TR may include an active layer ACT, a first transistor electrode TE1, a second transistor electrode TE2, and a gate electrode GE.

The active pattern ACT may mean a semiconductor layer. The active layer ACT may be disposed on the buffer layer BFL. The active layer ACT may include at least one of poly-silicon, amorphous silicon, and an oxide semiconductor.

The active pattern ACT may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate electrode GE may be disposed on the gate insulating layer GI. A position of the gate electrode GE may correspond to that of the channel region of the active pattern ACT. For example, the gate electrode GE may be disposed on the channel region of the active pattern ACT with the gate insulating layer GI interposed therebetween.

The gate insulating layer GI may be disposed over the active pattern ACT. The gate insulating layer GI may include an inorganic material. In an example, the gate insulating layer GI may include at least one of silicon nitride ($SiN_x$), silicon oxide ($SiO_x$), silicon oxynitride ($SiO_xN_y$), and aluminum oxide ($AlO_x$).

The first interlayer insulating layer ILD1 may be located over the gate electrode GE. Like the gate insulating layer GI, the first interlayer insulating layer ILD1 may include at least one of silicon nitride ($SiN_x$), silicon oxide ($SiO_x$), silicon oxynitride ($SiO_xN_y$), and aluminum oxide ($AlO_x$).

The first transistor electrode TE1 and the second transistor electrode TE2 may be located on the first interlayer insulating layer ILD1. The first transistor electrode TE1 may be in contact with the first contact region of the active pattern ACT while penetrating the gate insulating layer GI and the first interlayer insulating layer ILD1, and the second transistor electrode TE2 may be in contact with the second contact region of the active pattern ACT while penetrating the gate insulating layer GI and the first interlayer insulating layer ILD1. In an example, the first transistor electrode TE1 may be a drain electrode, and the second transistor electrode TE2 may be a source electrode. However, the disclosure is not limited thereto.

The second interlayer insulating layer ILD2 may be located over the first transistor electrode TE1 and the second transistor electrode TE2. Like the first interlayer insulating layer ILD1 and the gate insulating layer GI, the second interlayer insulating layer ILD2 may include an inorganic material. The inorganic material may include at least one of the materials listed as examples of the material constituting the first interlayer insulating layer ILD1 and the gate insulating layer GI, e.g., silicon nitride ($SiN_x$), silicon oxide ($SiO_x$), silicon oxynitride ($SiO_xN_y$), and aluminum oxide ($AlO_x$).

The bridge pattern BRP may be disposed on the second interlayer insulating layer ILD2. The bridge pattern BRP may be connected to the first transistor electrode TE1 through a contact hole penetrating the second interlayer insulating layer ILD2. The bridge pattern BRP may be electrically connected to a first electrode ELT1 through the first contact part CNT1 formed in the protective layer PSV.

The power line PL may be disposed on the second interlayer insulating layer ILD2. The power line PL may be electrically connected to a second electrode ELT2 through the second contact part CNT2 formed in the protective layer PSV.

The protective layer PSV may be located on the second interlayer insulating layer ILD2. The protective layer PSV may cover the bridge pattern BRP and the power line PL. The protective layer PSV may be provided in a form including an organic insulating layer, an inorganic insulating layer, or an organic insulating layer disposed on an inorganic insulating layer, but the disclosure is not limited thereto. In accordance with an embodiment, the first contact part CNT1 connected to a region of the bridge pattern BRP and the second contact part CNT2 connected to a region of the power line PL may be formed in the protective layer PSV.

The display element part DPL may be disposed on the pixel circuit part PCL. The display element part DPL may include a first bank pattern BNP1, a second bank pattern BNP2, the first electrode ELT1, the second electrode ELT2, a first insulating layer INS1, the light emitting element LD, a second insulating layer INS2, a first contact electrode CNE1, and a second contact electrode CNE2.

The first bank pattern BNP1 and the second bank pattern BNP2 may be disposed on the protective layer PSV. The first bank pattern BNP1 and the second bank pattern BNP2 may have a shape protruding in the display direction of the display device DD.

The first electrode ELT1 and the second electrode ELT2 may be disposed on the protective layer PSV. In accordance with an embodiment, at least a portion of the first electrode ELT1 may be arranged on the first bank pattern BNP1, and at least a portion of the second electrode ELT2 may be arranged on the second bank pattern BNP2. Therefore, each of the first electrode ELT1 and the second electrode ELT2 may serve as a reflective partition wall.

The first electrode ELT1 may be electrically connected to the bridge pattern BRP through the first contact part CNT1. The second electrode ELT2 may be electrically connected to the power line PL through the second contact part CNT2.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may apply an anode signal to the light emitting element LD.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may apply a cathode signal (e.g., a ground signal) to the light emitting element LD.

The first electrode ELT1 and the second electrode ELT2 may include a conductive material. In an example, the first electrode ELT1 and the second electrode ELT2 may include a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or any alloy thereof. However, the disclosure is not limited to the above-described example.

The first insulating layer INS1 may be disposed on the protective layer PSV. The first insulating layer INS1 may cover the first electrode ELT1 and the second electrode ELT2. The first insulating layer INS1 may stabilize connection between electrode components, and reduce external influence. The first insulating layer INS1 may include at least one of silicon nitride ($SiN_x$), silicon oxide ($SiO_x$), silicon oxynitride ($SiO_xN_y$), and aluminum oxide ($AlO_x$).

The light emitting element LD may be disposed on the first insulating layer INS1. The light emitting element LD may emit light, based on an electrical signal provided from the first contact electrode CNE1 and the second contact electrode CNE2.

The light emitting element LD may include a first semiconductor layer SEC1, a second semiconductor layer SEC2, and an active layer AL interposed between the first semiconductor layer SEC1 and the second semiconductor layer SEC2. In an example, the first semiconductor layer SEC1, the active layer AL, and the second semiconductor layer SEC2 may be sequentially stacked on each other along a length direction of the light emitting element LD.

In accordance with an embodiment, the first semiconductor layer SEC1 may be disposed adjacent to a first end portion EP1 of the light emitting element LD, and the second semiconductor layer SEC2 may be disposed adjacent to a second end portion EP2 of the light emitting element LD.

In accordance with an embodiment, the light emitting element LD may have a pillar shape. The pillar shape may mean a shape extending in a length direction thereof, such as a cylinder or a polyprism. The shape of a section of the light emitting element LD may be a rod-like shape or bar-like shape, but the disclosure is not limited thereto.

In accordance with an embodiment, the light emitting element LD may have a size of nanometer scale to micrometer scale.

The first semiconductor layer SEC1 may be a first conductivity type semiconductor layer. For example, the first semiconductor layer SEC1 may include an N-type semiconductor layer. In an example, the first semiconductor layer SEC1 may include at least one semiconductor material among InAlGaN, GaN, AlGaN, InGaN, AlN, and InN, and include an N-type semiconductor layer doped with a first conductivity type dopant such as Si, Ge, Sn, or a combination thereof. However, the material constituting the first semiconductor layer SEC1 is not limited thereto.

The active layer AL may be disposed on the first semiconductor layer SEC1, and be formed in a single-quantum well structure or a multi-quantum well structure. The position of the active layer AL may be variously changed according to the kind of the light emitting element LD.

A clad layer (not shown) doped with a conductive dopant may be formed on the top and/or the bottom of the active layer AL. In an example, the clad layer may be formed as an AlGaN layer or an InAlGaN layer. In some embodiments, a material such as AlGaN or InAlGaN may be used to form the active layer AL. The active layer AL may be configured of various materials.

The second semiconductor layer SEC2 may be formed on the active layer AL, and may include a semiconductor layer having a type different from that of the first semiconductor layer SEC1. For example, the second semiconductor layer SEC2 may include a P-type semiconductor layer. In an example, the second semiconductor layer SEC2 may include at least one semiconductor material among InAlGaN, GaN, AlGaN, InGaN, AlN, and InN, and include a P-type semiconductor layer doped with a second conductivity type dopant such as Mg. However, the material constituting the second semiconductor layer SEC2 is not limited thereto. The second semiconductor layer SEC2 may be configured of various materials.

In case that a voltage which may be a threshold voltage or more is applied to both ends of the light emitting element LD, electron-hole pairs may be combined in the active layer AL, and the light emitting element LD emits light. The light emission of the light emitting element LD may be controlled by using such a principle, so that the light emitting element LD can be used as a light source for various light emitting devices, including the pixel of the display device.

The light emitting element LD may further include an element insulating film INF provided on a surface thereof. The element insulating film INF may be formed with a single film or multiple films.

The element insulating film INF may expose both end portions of the light emitting element LD, which may have different polarities. For example, the element insulating film INF may expose a portion of each of the first semiconductor layer SEC1 disposed adjacent to the first end portion EP1 and the second semiconductor layer SEC2 disposed adjacent to the second end portion EP2.

The element insulating film INF may be a single layer or a multi-layer, including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the disclosure is not limited thereto.

The element insulating film INF can ensure electrical stability. Also, the element insulating film INF can prevent an unwanted short circuit from occurring between multiple light emitting elements LD even in case that the light emitting elements LD are disposed close to each other.

In accordance with an embodiment, the light emitting element LD may further include an additional component in addition to the first semiconductor layer SEC1, the active layer AL, the second semiconductor layer SEC2, and the element insulating film INF. For example, the light emitting elements LD may additionally include a phosphor layer, an active layer, a semiconductor layer, and/or an electrode layer. In an example, a contact electrode layer may be further disposed at each of the first and second end portions EP1 and EP2 of the first light emitting element LD.

The second insulating layer INS2 may be disposed on the light emitting element LD. The second insulating layer INS2 may cover the active layer AL of the light emitting element LD. In an example, the second insulating layer INS2 may include at least one of an organic material and an inorganic material.

In accordance with an embodiment, at least a portion of the second insulating layer INS2 may be located on a rear surface of the light emitting element LD. The second insulating layer INS2 may fill at least a portion of a groove formed on the rear surface of the light emitting element LD.

The first contact electrode CNE1 and the second contact electrode CNE2 may be disposed on the first insulating layer INS1. The first contact electrodes CNE1 may electrically connect the first electrode ELT1 and the light emitting element LD to each other, and the second contact electrode CNE2 may electrically connect the second electrode ELT2 and the light emitting element LD to each other.

The first contact electrode CNE1 and the second contact electrode CNE2 may include a conductive material. In an example, the first contact electrode CNE1 may include a transparent conductive material including Indium Tin Oxide (ITO), Indium Zinc Oxide (IZO), and Indium Tin Zinc Oxide (ITZO), but the disclosure is not limited thereto.

The arrangement relationship of the light emitting element LD, the electrodes, and the like is not limited to the example described with reference to FIG. 4, and arrangement relationships in accordance with various modifiable embodiments may be implemented.

In an example, although not shown in the drawing, the display element part DPL may further include a planarization layer and/or an additional insulating layer, disposed on the first contact electrode CNE1 and the second contact electrode CNE2.

A sectional structure of a pixel PXL in accordance with another embodiment of the disclosure will be described with reference to FIG. 5. FIG. 5 is a schematic sectional view of a pixel in accordance with another embodiment of the disclosure.

The pixel PXL shown in FIG. 5 may be different from the pixel PXL in accordance with the embodiment of the disclosure (see FIG. 4), in that a light emitting element LD may be an organic light emitting diode.

Referring to FIG. 5, the light emitting element LD may be implemented as an organic light emitting diode. In accordance with this embodiment, the light emitting element LD may be an organic light emitting element LD.

In accordance with an embodiment, the light emitting element LD may be disposed in an area defined by a pixel defining layer PDL. A surface of the light emitting element LD may be connected to a first electrode ELT1, and another surface of the light emitting element LD may be connected to a second electrode ELT2.

The first electrode ELT1 may be an anode electrode with respect to the light emitting element LD, and the second electrode ELT2 may be a common electrode (or cathode electrode) with respect to the light emitting element LD.

In accordance with an embodiment, the light emitting element LD may have a multi-layered thin film structure including a light generation layer. The light emitting element LD may include a hole injection layer for injecting holes, a hole transport layer for increasing a hole recombination opportunity by suppressing movement of electrons which may be excellent in transportability of holes and may not be combined in a light generation layer, the light generation layer for emitting light by recombination of the injected electrons and holes, a hole blocking layer for suppressing the movement of the holes that may not be combined in the light generation layer, an electron transport layer for smoothly transporting the electrons to the light generation layer, and an electron injection layer for injecting the electrons. The light emitting element LD may emit light, based on an electrical signal provided from the first electrode ELT1 and the second electrode layer ELT2.

In accordance with an embodiment, a display element part DPL may include the pixel defining layer PDL and a thin film encapsulation layer TFE.

The pixel defining layer PDL may define a position at which the light emitting element LD implemented as the organic light emitting diode may be arranged. The pixel defining layer PDL may include an organic material. In an example, the pixel defining layer PDL may include at least one of acryl resin, epoxy resin, phenolic resin, polyamide resin, and polyimide resin, but the disclosure is not limited thereto.

The thin film encapsulation layer TFE may be disposed on the second electrode ELT2. The thin film encapsulation layer TFE may cancel a step difference generated by the light emitting element LD and the pixel defining layer PDL. The thin film encapsulation layer TFE may include multiple insulating layers covering the light emitting element LD. In an example, the thin film encapsulation layer TFE may have a structure in which an inorganic layer and an organic layer may be alternately stacked on each other.

Hereinafter, a light control part LCP and an upper film layer UFL, which may be included in a pixel PXL in accordance with an embodiment of the disclosure, will be described with reference to FIGS. 6 and 7.

FIG. 6 is a schematic view illustrating a structure of a pixel PXL in accordance with an embodiment of the disclosure. FIG. 7 is a schematic view illustrating a structure of a pixel PXL in accordance with another embodiment of the disclosure.

Figure 7:
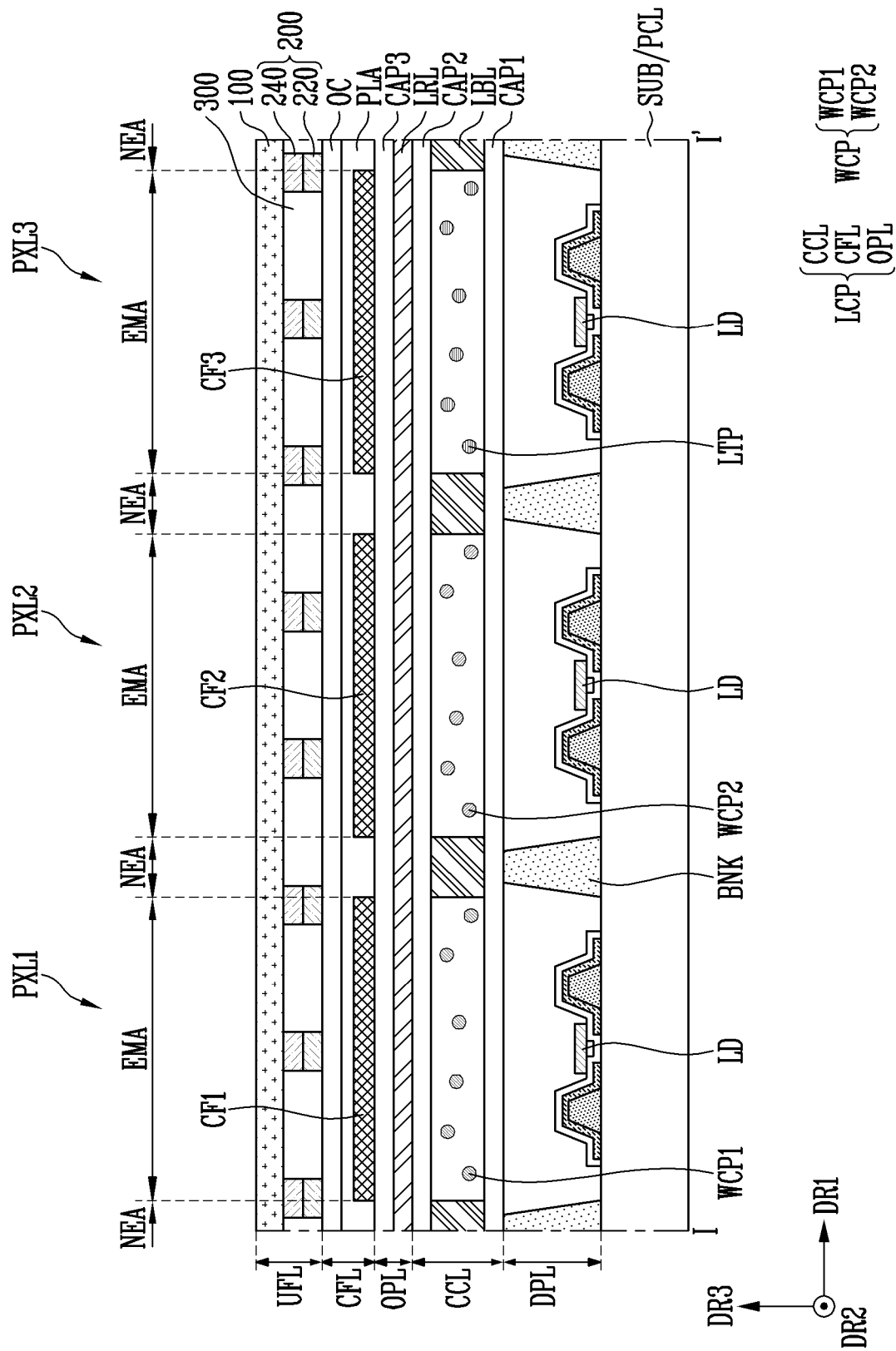
FIG. 7 is a schematic view illustrating a structure of a pixel in accordance with another embodiment of the disclosure, and is a sectional view illustrating a section taken along line I-I' shown in FIG. 2.

In FIGS. 6 and 7, a light control part LCP and an upper film layer UFL are illustrated, and a pixel circuit part PCL and a display element part DPL are partially and briefly illustrated.

FIG. 6 is a view illustrating a structure of a pixel in accordance with an embodiment of the disclosure, and is a sectional view illustrating a section taken along line I-I' shown in FIG. 2. FIG. 7 is a view illustrating a structure of a pixel in accordance with another embodiment of the disclosure, and is a sectional view illustrating a section taken along line I-I' shown in FIG. 2.

First, a pixel PXL in accordance with an embodiment of the disclosure will be described with reference to FIG. 6.

Referring to FIG. 6, the display element part DPL may further include a bank BNK. The bank BNK may protrude in the display direction of the display device DD (e.g., the third direction DR3). The bank BNK may define an emission area EMA of the pixel PXL. The bank BNK may have a shape surrounding the emission area EMA. A light emitting element LD may be dispose in an area surrounded by the bank BNK. In accordance with an embodiment, the bank BNK may include an organic material or an inorganic material, but the disclosure is not limited thereto.

The light control part LCP may include a wavelength conversion layer CCL, an optical layer OPL, and a color filter layer CFL.

In accordance with an embodiment, light emitting elements LD disposed in each of the first pixel PXL1, the second pixel PXL2, and the third pixel PXL3 may emit light of the same color. For example, the first pixel PXL1, the second pixel PXL2, and the third pixel PXL3 may include light emitting elements LD emitting light of the third color, e.g., blue light. The light control part LCP may be in the first pixel PXL1, the second pixel PXL2, and the third pixel PXL3, to display a full-color image. However, the disclosure is not necessarily limited thereto, and the first pixel PXL1, the second pixel PXL2, and the third pixel PXL3 may include light emitting elements LD emitting lights of different colors.

In accordance with an embodiment, the color conversion layer CCL and the display element part DPL may be disposed in the same layer. In an example, at least a portion of the color conversion layer CCL may be disposed between banks BNK.

The color conversion layer CCL may include a wavelength conversion pattern WCP, a light transmission pattern LTP, and a first capping layer CAP1. In an example, the wavelength conversion pattern WCP may include a first wavelength conversion pattern WCP1 and a second wavelength conversion pattern WCP2.

The first wavelength conversion pattern WCP1 may be disposed to overlap an emission area EMA of the first pixel PXL1. For example, the first wavelength conversion pattern WCP1 may be provided between banks BNK, to overlap the emission area EMA of the first pixel PXL1 in a plan view.

The second wavelength conversion pattern WCP2 may be disposed to overlap an emission area EMA of the second pixel PXL2. For example, the second wavelength conversion pattern WCP2 may be provided between banks BNK, to overlap the emission area EMA of the second pixel PXL2 in a plan view.

The light transmission pattern LTP may be disposed to overlap an emission area EMA of the third pixel PXL3. For example, the light transmission pattern LTP may be provided between banks BNK, to overlap the emission area EMA of the third pixel PXL3 in a plan view.

In accordance with an embodiment, the first wave conversion pattern WCP1 may include first color conversion particles for converting light of the third color, which may be emitted from the light emitting element LD, into light of the first color. In an example, in case that the light emitting element LD is a blue light emitting element emitting blue light, and the first pixel PXL1 is a red pixel, the first wavelength conversion pattern WCP1 may include a first quantum dot for converting blue light, which may be emitted from the blue light emitting element LD, into red light.

For example, the first wavelength conversion pattern WCP1 may include multiple first quantum dots dispersed in a matrix material such as base resin. The first quantum dot may absorb blue light and emit red light by shifting a wavelength of the blue light according to energy transition. In case that the first pixel PXL1 is a pixel of another color, the first wavelength conversion pattern WCP1 may include a first quantum dot corresponding to the color of the first pixel PXL1.

In accordance with an embodiment, the second wavelength conversion pattern WCP2 may include second color conversion particles for converting light of the third color, which may be emitted from the light emitting element LD, into light of the second color. In an example, in case that the light emitting element LD is a blue light emitting element emitting blue light, and the second pixel PXL2 is a green pixel, the second wavelength conversion pattern WCP2 may include a second quantum dot for converting blue light, which may be emitted from the blue light emitting element, into green light.

For example, the second wavelength conversion pattern WCP2 may include multiple second quantum dots dispersed in a matrix material such as base resin. The second quantum dot may absorb blue light and emit green light by shifting a wavelength of the blue light according to energy transition. In case that the second pixel PXL2 is a pixel of another color, the second wavelength conversion pattern WCP2 may include a second quantum dot corresponding to the color of the second pixel PXL2.

The first quantum dot and the second quantum dot may have shape such as a spherical shape, a pyramid shape, a multi-arm shape, a cubic nano particle, a nano wire, a nano fabric, or a nano plate particle. However, the disclosure is not necessarily limited thereto, and the shape of the first quantum dot and the second quantum dot may be variously changed.

In an example, light of blue having a relatively short wavelength in a visible light band may be incident into the first quantum dot and the second quantum dot, so that absorption coefficients of the first quantum dot and the second quantum dot can be increased. Accordingly, the efficiency of light finally emitted from the first pixel PXL1 and the second pixel PXL2 can be improved, and excellent color reproduction can be ensured. The pixel unit of the first to third pixels PXL1, PXL2, and PXL3 may use light emitting elements LD of the same color (e.g., blue light emitting elements), so that the manufacturing efficiency of the display device can be improved.

In accordance with an embodiment, the light transmission pattern LTP may be selectively provided to efficiently use light of the third color emitted from the light emitting element LD. In an example, in case that the light emitting element LD is a blue light emitting element emitting blue light, and the third pixel PXL3 is a blue pixel, the light transmission pattern LTP may include at least one kind of light scattering particles to efficiently use light emitted from the light emitting element LD.

For example, the light transmission pattern LTP may include light scattering particles dispersed in a matrix material such as base resin. In an example, the light transmission pattern LTP may include light scattering particles such as silica, but the material constituting the light scattering particles is not limited thereto.

The light scattering particles may not be disposed in only the emission area EMA of the third pixel PXL3. In an example, the light scattering particles may be selectively included even at the inside of the first wavelength conversion pattern WCP1 and/or the second wavelength conversion pattern WCP2.

The first capping layer CAP1 may encapsulate (or cover) the wave conversion pattern WCP and the light transmission pattern LTP. The first capping layer CAP1 may be disposed between a low refractive layer LRL and the display element part DPL. The first capping layer CAP1 may be provided throughout the first to third pixels PXL1, PXL2, and PXL3. The first capping layer CAP1 may prevent the color conversion layer CCL from being damaged or contaminated due to infiltration of an impurity such as moisture or air from the outside.

In accordance with an embodiment, the first capping layer CAP1 may be a single layer or a multi-layer including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the disclosure is not limited thereto.

The optical layer OPL may include the low refractive layer LRL and a second capping layer CAP2. The optical layer OPL may be disposed on the color conversion layer CCL. The optical layer OPL may be disposed on the display element part DPL.

The low refractive layer LRL may be disposed between the first capping layer CAP1 and the second capping layer CAP2. The low refractive layer LRL may be disposed between the color conversion layer CCL and the color filter layer CFL. The low refractive layer LRL may be provided throughout the first to third pixels PXL1, PXL2, and PXL3.

The low refractive layer LRL may function to allow light provided from the color conversion layer CCL to be recycled by total reflection, thereby improving light efficiency. To this end, the low refractive layer LRL may have a refractive index relatively lower than that of the color conversion layer CCL.

In accordance with an embodiment, the low refractive layer LRL may include a base resin and hollow particles dispersed in the base resin. The hollow particle may include a hollow silica particle. In other embodiments, the hollow particle may be a pore formed by porogen, but the disclosure is not necessarily limited thereto. Also, the low refractive layer LRL may include at least one of a zinc oxide (ZnO) particle, a titanium dioxide ($TiO_2$) particle, and a nano silicate particle, but the disclosure is not necessarily limited thereto.

The second capping layer CAP2 may be disposed on the low refractive layer LRL. The second capping layer CAP2 may be disposed between the color filter layer CFL and the low refractive layer LRL. The second capping layer CAP2 may be provided throughout the first to third pixels PXL1, PXL2, and PXL3. The second capping layer CAP2 may prevent the low refractive layer LRL from being damaged or contaminated due to infiltration of an impurity such as moisture or air from the outside.

In accordance with an embodiment, the second capping layer CAP2 may be a single layer or a multi-layer including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the disclosure is not limited thereto.

The color filter layer CFL may be disposed on the second capping layer CAP2. The color filter layer CFL may be provided throughout the first to third pixels PXL1, PXL2, and PXL3. The color filter layer CFL may include color filters CF1, CF2, and CF3, a planarization layer PLA, and an overcoat layer OC.

In accordance with an embodiment, the color filters CF1, CF2, and CF3 may be disposed on the second capping layer CAP2. In a plan view, the color filters CF1, CF2, and CF3 may overlap the emission areas EMA of the first to third pixels PXL1, PXL2, and PXL3.

In accordance with an embodiment, a first color filter CF1 may allow light of the first color to be transmitted therethrough, and may not allow light of the second color and light of the third color to be transmitted therethrough. In an example, the first color filter CF1 may include a colorant of the first color.

In accordance with an embodiment, a second color filter CF2 may allow light of the second color to be transmitted therethrough, and may now allow light of the first color and light of the third color to be transmitted therethrough. In an example, the second color filter CF2 may include a colorant of the second color.

In accordance with an embodiment, a third color filter CF3 may allow light of the third color to be transmitted therethrough, and may not allow light of the first color and light of the second color to be transmitted therethrough. In an example, the third color filter CF3 may include a colorant of the third color.

In accordance with an embodiment, the planarization layer PLA may be provided over the color filters CF1, CF2, and CF3. The planarization layer PLA may cover the color filters CF1, CF2, and CF3. The planarization layer PLA may cancel a step difference occurring due to the color filters CF1, CF2, and CF3. The planarization layer PLA may be provided throughout the first to third pixels PXL1, PXL2, and PXL3.

In accordance with an embodiment, the planarization layer PLA may include an organic material such as acryl resin, epoxy resin, phenolic resin, polyamides resin, polyimides resin, unsaturated polyesters resin, poly-phenylene ethers resin, poly-phenylene sulfides resin, benzocyclobutene (BCB), or a combination thereof. However, the disclosure is not necessarily limited thereto, and the planarization layer PLA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof.

The overcoat layer OC may be disposed on the planarization layer PLA. The overcoat layer OC may be disposed between the upper film layer UFL and the color filter layer CFL. The overcoat layer OC may be provided throughout the first to third pixels PXL1, PXL2, and PXL3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

In accordance with an embodiment, the overcoat layer OC may include an organic material such as acryl resin, epoxy resin, phenolic resin, polyamides resin, polyimides resin, unsaturated polyesters resin, poly-phenylene ethers resin, poly-phenylene sulfides resin, benzocyclobutene (BCB), or a combination thereof. However, the disclosure is not necessarily limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof.

The upper film layer UFL may be disposed on the light control part LCP. The upper film layer UFL may be disposed on the color filter layer CFL. The upper film layer UFL may be disposed at an outer portion of the display device DD to reduce external influence on the display device DD. The upper film layer UFL may be provided throughout the first to third pixels PXL1, PXL2, and PXL3.

In accordance with an embodiment, the upper film layer UFL may include an outer film 100, an anti-electrostatic pattern 200, and a planarization layer 300.

The anti-electrostatic pattern 200 may be disposed on the light control part LCP. The anti-electrostatic pattern 200 may be disposed between the outer film 100 and the color filter layer CFL. The anti-electrostatic pattern 200 may be disposed on the bottom of a surface of the outer film 100.

The anti-electrostatic pattern 200 may be provided to be patterned in a shape. In an example, the anti-electrostatic pattern 200 may be arranged in a mesh shape.

In accordance with an embodiment, the anti-electrostatic pattern 200 may be provided such that a shape may be periodically patterned. In accordance with another embodiment, the anti-electrostatic pattern 200 may be provided to be patterned in shapes formed at random.

The anti-electrostatic pattern 200 may include a conductive material. Accordingly, the anti-electrostatic pattern 200 may receive an electrical signal.

In accordance with an embodiment, the anti-electrostatic pattern 200 may have a line width suitable for preventing reflection. The anti-electrostatic pattern 200 may have a width of less than about 10 μm. In other embodiments, in accordance with an embodiment, the width of the anti-electrostatic pattern 200 may be less than about 7 μm or less than about 5 μm. The width of the anti-electrostatic pattern 200 may mean a length defined according to a length direction of the substrate SUB.

In accordance with an embodiment, the line width of the anti-electrostatic pattern 200 may be smaller than a size of each of the first to third pixels PXL1, PXL2, and PXL3. For example, the line width of the anti-electrostatic pattern 200 may be smaller than a width of the emission area EMA of each of the first to third pixels PXL1, PXL2, and PXL3 in a first direction DR1.

Although not separately shown in the drawing, the anti-electrostatic pattern 200 may be electrically connected to a connection line disposed at an outer portion of the display area DA (or the non-display area NDA). The connection line may be electrically connected to the anti-electrostatic pattern 200 and an external line, so that an electrical signal can be moved to the external line when an electrostatic phenomenon occurs in the anti-electrostatic pattern 200.

The anti-electrostatic pattern 200 may include a conductive pattern 220 and an anti-reflection pattern 240. FIG. 6 relates to a first embodiment. In accordance with the first embodiment, the anti-reflection pattern 240 may be disposed between the outer film 100 and the conductive pattern 220.

The conductive pattern 220 may be arranged in a pattern, including a conductive material. For example, the conductive pattern 220 may include a metal material including at least one of Ag, copper (Cu), Ni, and Au. However, the disclosure is not limited to a specific example, and the conductive pattern 220 may include various conductive materials.

In accordance with an embodiment, the conductive pattern 220 may be formed through a metallization process. For example, the conductive pattern 220 may be formed by depositing Ag in a pattern.

The anti-reflection pattern 240 may be arranged in a pattern, including a light blocking material. For example, the anti-reflection pattern 240 may be formed of an organic material including at least one of graphite, carbon black, black pigment, and black dye, and include a metal material including chromium (Cr). However, the disclosure is not limited to a specific example, and the anti-reflection pattern 240 may include a material having a reflexibility of less than about 30%.

In accordance with an embodiment, the conductive pattern 220 and the anti-reflection pattern 240 may be manufactured (or patterned) by using the same photomask, and accordingly, process cost can be reduced.

In accordance with an embodiment, as described above, since the conductive pattern 220 and the anti-reflection pattern 240 may be manufactured by using the same photomask, the conductive pattern 220 and the anti-reflection pattern 240 may have the same shape in a plan view. The conductive pattern 220 and the anti-reflection pattern 240 may be formed in the same pattern.

In accordance with an embodiment, the conductive pattern 220 and the anti-reflection pattern 240 may be provided together, so that reflection caused by external light and light provided from the display element part DPL can be prevented while reducing influence caused by static electricity.

The planarization layer 300 may be disposed on the light control part LCP. The planarization layer 300 may be disposed between the color filter layer CFL and the outer film 100. The planarization layer 300 may cancel a step difference occurring due to the anti-electrostatic pattern 200.

In accordance with an embodiment, the planarization layer 300 may include an organic insulating material. However, the disclosure is not limited thereto, and the planarization layer 300 may include at least one of the materials listed as examples with reference to the planarization layer PLA.

The outer film 100 may be disposed at an outer portion of the pixel PXL. For example, the outer film 100 may be further spaced apart from the substrate SUB, as compared with the display element part DPL. The outer film 100 may be disposed on a front surface of the display device DD, to protect the front surface of the display device DD. The anti-electrostatic pattern 200 may be provided on a surface of the outer film 100.

In accordance with an embodiment, the outer film 100 may have a light transmitting property. In an example, the outer film 100 may be at least one of a polyethylenephthalate (PET) film, a low reflective film, a polarizing film, and a transmittance controllable film, but the disclosure is not necessarily limited thereto.

In some embodiments, the outer film 100 may include an anti-reflective (AR) coating for decreasing reflexibility of light incident from the outside. The AR coating may mean a component formed by coating a material having an anti-reflection function on a surface of a specific component. The coated material may have a low reflexibility. In an example, the material used for the AR coating may include at least one of $SiO_x$, $ZiO_x$, $Al_xO_y$, and $TiO_x$. However, the disclosure is not limited thereto, and various materials may be applied.

In accordance with an embodiment, shapes of the anti-electrostatic pattern 200, which may be respectively defined in adjacent pixels PXL, may be different from each other. For example, the shapes of the anti-electrostatic pattern 200 may be disposed to be dislocated in areas of adjacent pixels PXL, and therefore, shapes of the anti-electrostatic pattern 200, which may be respectively defined in the first to third pixels PXL1, PXL2, and PXL3, may not be the same. For example, a shape of the anti-electrostatic pattern 200, which may be defined in the emission area EMA of the first pixel PXL1, and a shape of the anti-electrostatic pattern 200, which may be defined in the emission area EMA of the second pixel PXL2, may be different from each other. Similarly, the shape of the anti-electrostatic pattern 200, which may be defined in the emission area EMA of the second pixel PXL2, and a shape of the anti-electrostatic pattern 200, which may be defined in the emission area EMA of the third pixel PXL3, may be different from each other.

It has been described above that the shape of the anti-electrostatic pattern 200 may be patterned in a shape (e.g., a mesh shape). The anti-electrostatic pattern 200 may be disposed to be dislocated in the emission areas EMA of the first to third pixels PXL1, PXL2, and PXL3 while being patterned in a shape, so that the external visibility of the display device DD can be further improved.

A structure of a pixel PXL in accordance with another embodiment of the disclosure will be described with reference to FIG. 7.

Referring to FIG. 7, the pixel PXL in accordance with an embodiment of the disclosure may be different from the pixel PXL in accordance with the above-described embodiments (see FIG. 6), in that the color conversion layer CCL may be disposed in a layer different from that of the display element part DPL.

In accordance with this embodiment, the color conversion layer CCL may be disposed on the display element part DPL. For example, the first capping layer CAP1 may encapsulate (or cover) the area in which the light emitting elements LD may be disposed, and the color conversion layer CCL may be disposed on the first capping layer CAP1.

In accordance with this embodiment, the color conversion layer CCL may further include a light blocking layer LBL. The light blocking layer LBL may be disposed on the display element part DPL. The light blocking layer LBL may be disposed between the first capping layer CAP1 and the second capping layer CAP2. The light blocking layer LBL may be disposed to surround the first wavelength conversion pattern WCP1, the second wavelength conversion pattern WCP2, and the light transmission pattern LTP at a boundary of the first to third pixels PXL1, PXL2, and PXL3.

The light blocking layer LBL may define the emission area EMA and the non-emission area NEA. In an example, the light blocking layer LBL may overlap the non-emission area NEA in a plan view. In an example, an area in which the light blocking layer LBL may not be disposed may be defined as the emission area EMA of each of the first to third pixels PXL1, PXL2, and PXL3.

In accordance with an embodiment, the light blocking layer LBL may be formed of an organic material including at least one of graphite, carbon black, black pigment, and black dye, or include a metal material including chromium (Cr). However, the material of the light blocking layer LBL is not limited and should be a material capable of blocking transmission of light or absorbing light.

In accordance with this embodiment, the second capping layer CAP2 may encapsulate (or cover) the first wavelength conversion pattern WCP1, the second wavelength conversion pattern WCP2, and the light transmission pattern LTP.

In accordance with this embodiment, the low refractive layer LRL may be disposed between the second capping layer CAP2 and a third capping layer CAP3. Like the first capping layer CAP1 and the second capping layer CAP2, the third capping layer CAP3 may be a single layer or a multi-layer, including at least one insulating material among silicon oxide (SiO$_x$), silicon nitride (SiN$_x$), silicon oxynitride (SiO$_x$N$_y$), aluminum oxide (AlO$_x$), and titanium oxide (TiO$_x$), but the disclosure is not limited thereto.

The structure of the pixel PXL is not limited to that described with reference to FIGS. 4 to 7. In some embodiments, various arrangement relationships of components may be implemented.

Hereinafter, an outer film 100 and an anti-electrostatic pattern 200 in accordance with an embodiment of the disclosure will be described in more detail with reference to FIGS. 8 to 13.

Figure 8:
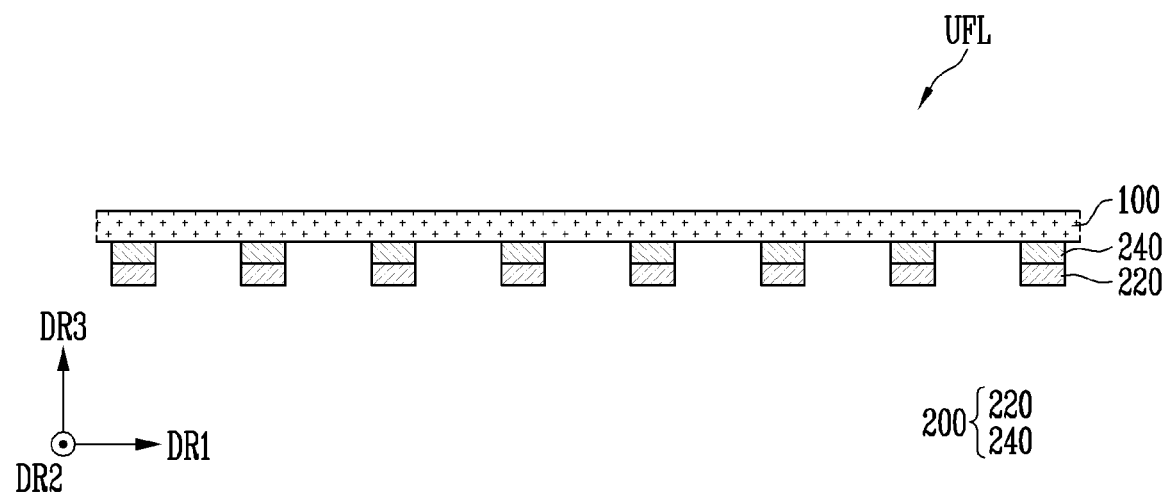
FIGS. 8 to 10 are schematic sectional views illustrating an upper film layer in accordance with an embodiment of the disclosure.
Figure 9:
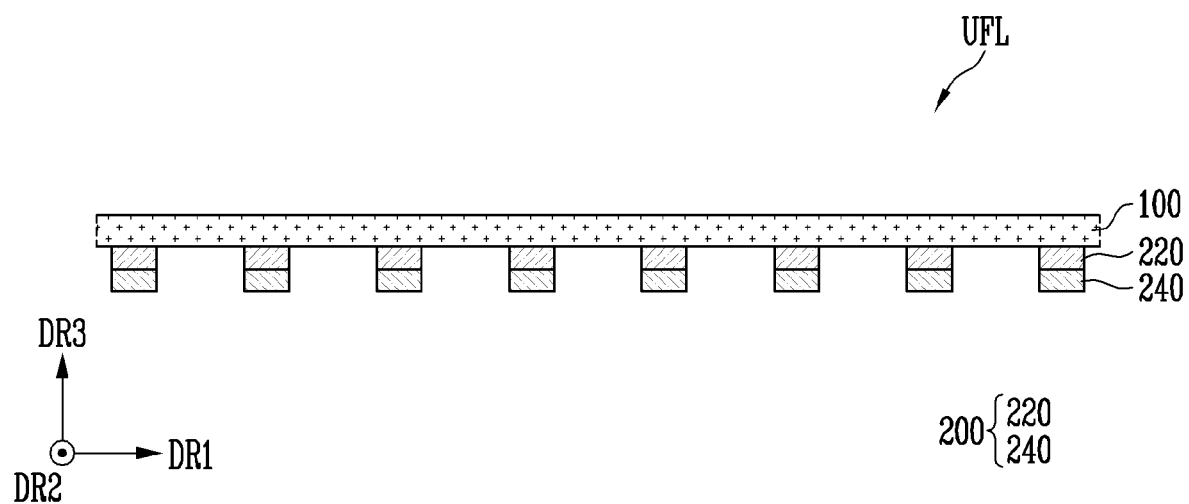
Figure 10:
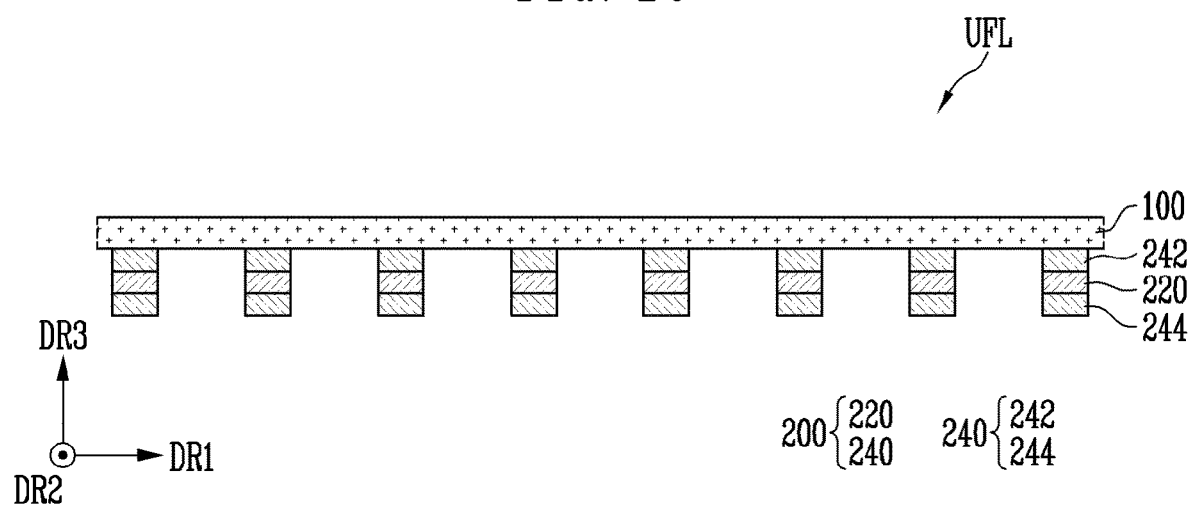

FIGS. 8 to 10 are schematic sectional views illustrating an upper film layer in accordance with an embodiment of the disclosure. In FIGS. 8 to 10, for convenience of description, illustration of the planarization layer 300 in the upper film layer UFL is omitted.

FIG. 8 is a view illustrating an upper film layer UFL in accordance with a first embodiment of the disclosure.

FIG. 9 is a view illustrating an upper film layer UFL in accordance with a second embodiment of the disclosure.

FIG. 10 is a view illustrating an upper film layer UFL in accordance with a third embodiment of the disclosure.

First, the upper film layer UFL in accordance with the first embodiment of the disclosure will be described with reference to FIG. 8.

FIG. 8 illustrates the upper film layer UFL in accordance with the first embodiment of the disclosure. In accordance with the first embodiment, the anti-reflection pattern 240 may be disposed between the conductive pattern 220 and the outer film 100.

For example, the conductive pattern 220 and the anti-reflection pattern 240 may overlap each other in a plan view. The outer film 100 may be disposed on a surface of the anti-reflection pattern 240, and the conductive pattern 220 may be disposed on another surface of the anti-reflection pattern 240.

In accordance with this embodiment, a surface of the conductive pattern 220 may not be in contact with the anti-reflection pattern 240, and another surface of the conductive pattern 220 may be in contact with the anti-reflection pattern 240.

The upper film layer UFL in accordance with the second embodiment of the disclosure will be described with reference to FIG. 9.

In accordance with the second embodiment, the conductive pattern 220 may be disposed between the anti-reflection patter 240 and the outer film 100.

For example, the conductive pattern 220 and the anti-reflection pattern 240 may overlap each other in a plan view. The outer film 100 may be disposed on a surface of the conductive pattern 220, and the anti-reflection pattern 240 may be disposed on another surface of the conductive pattern 220.

The upper film layer UFL in accordance with the third embodiment of the disclosure will be described with reference to FIG. 10.

In accordance with the third embodiment, the anti-reflection pattern 240 may include a first anti-reflection pattern 242 and a second anti-reflection pattern 244. The first anti-reflection pattern 242, the second anti-reflection pattern 244, and the conductive pattern 220 may overlap each other in a plan view.

In accordance with this embodiment, the first anti-reflection pattern 242 may be disposed between the outer film 100 and the conductive pattern 220, and the second anti-reflection pattern 244 may be spaced apart from the outer film 100.

For example, the conductive pattern 220 may be disposed between the first anti-reflection pattern 242 and the second anti-reflection pattern 244. The first anti-reflection pattern 242 may be disposed on a surface of the conductive pattern 220, and the second anti-reflection pattern 244 may be disposed on another surface of the conductive pattern 220. The second anti-reflection pattern 244 may be disposed on a surface of the conductive pattern 220, on which the first anti-reflection pattern 242 may not be disposed.

It has been described above that, in the upper film layer UFL in accordance with the embodiment of the disclosure, the anti-electrostatic pattern 200 may be patterned in a shape. Hereinafter, shapes of the anti-electrostatic pattern 200 in a plan view will be described with reference to FIGS. 11 to 13.

Figure 11:
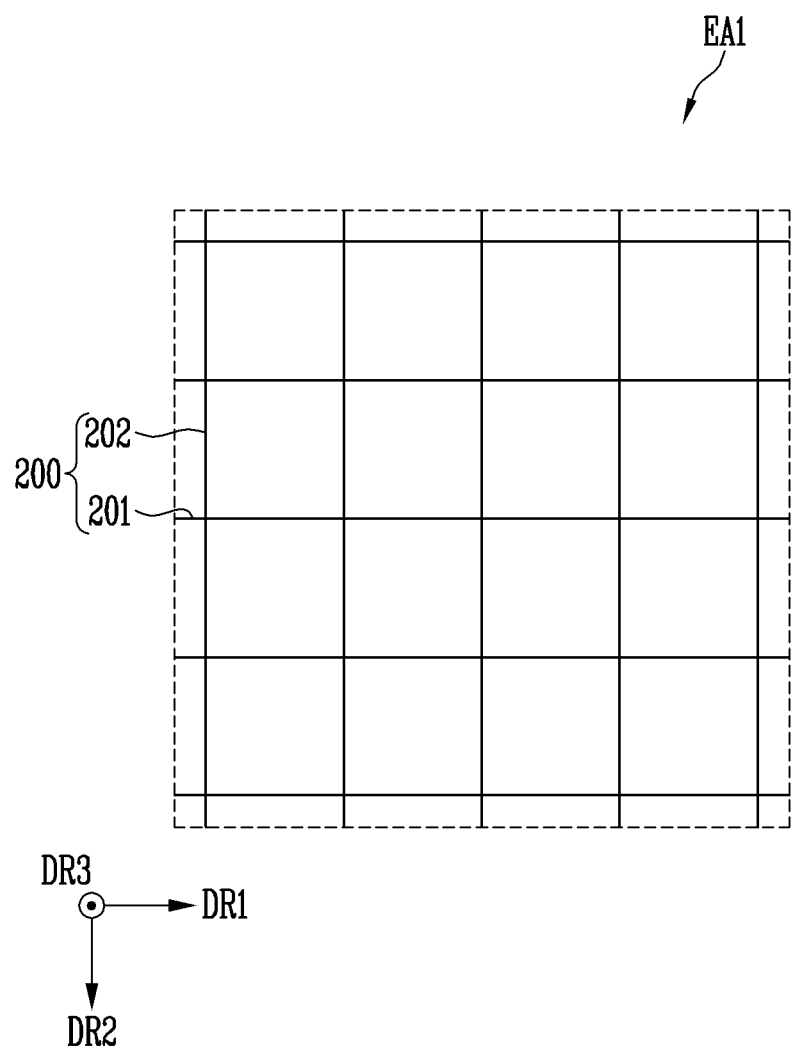
FIGS. 11 to 13 are schematic plan views illustrating shapes of an anti-electrostatic pattern in accordance with embodiments of the disclosure.
Figure 12:
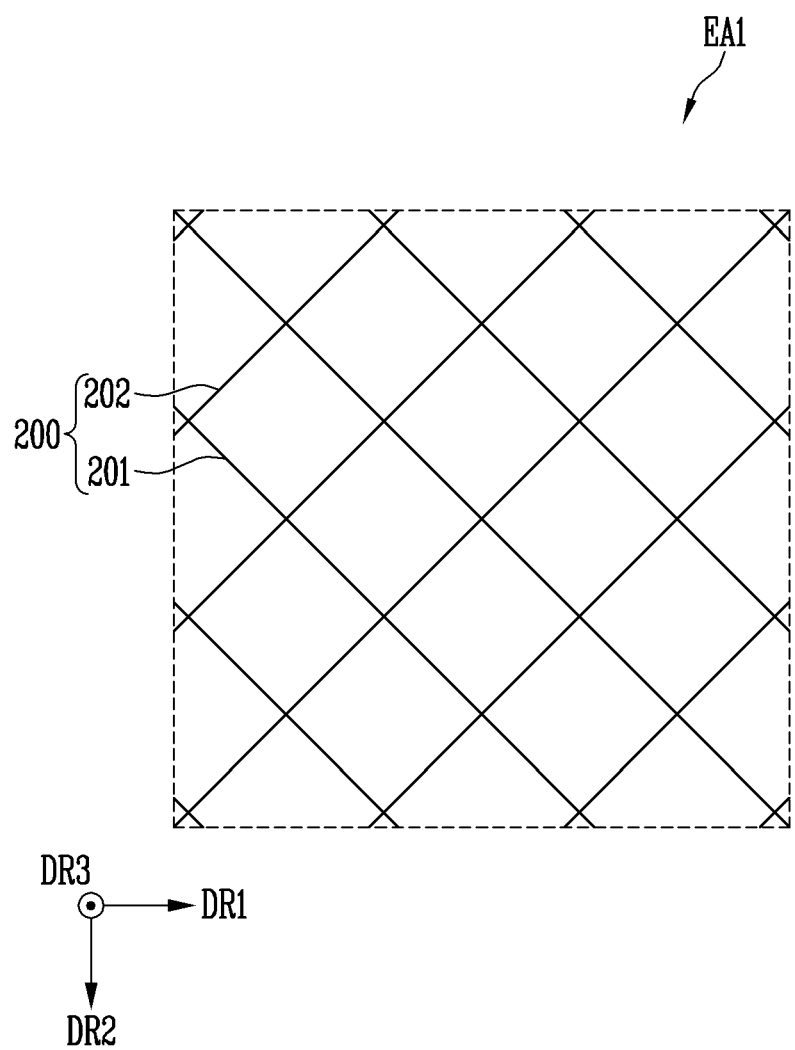
Figure 13:
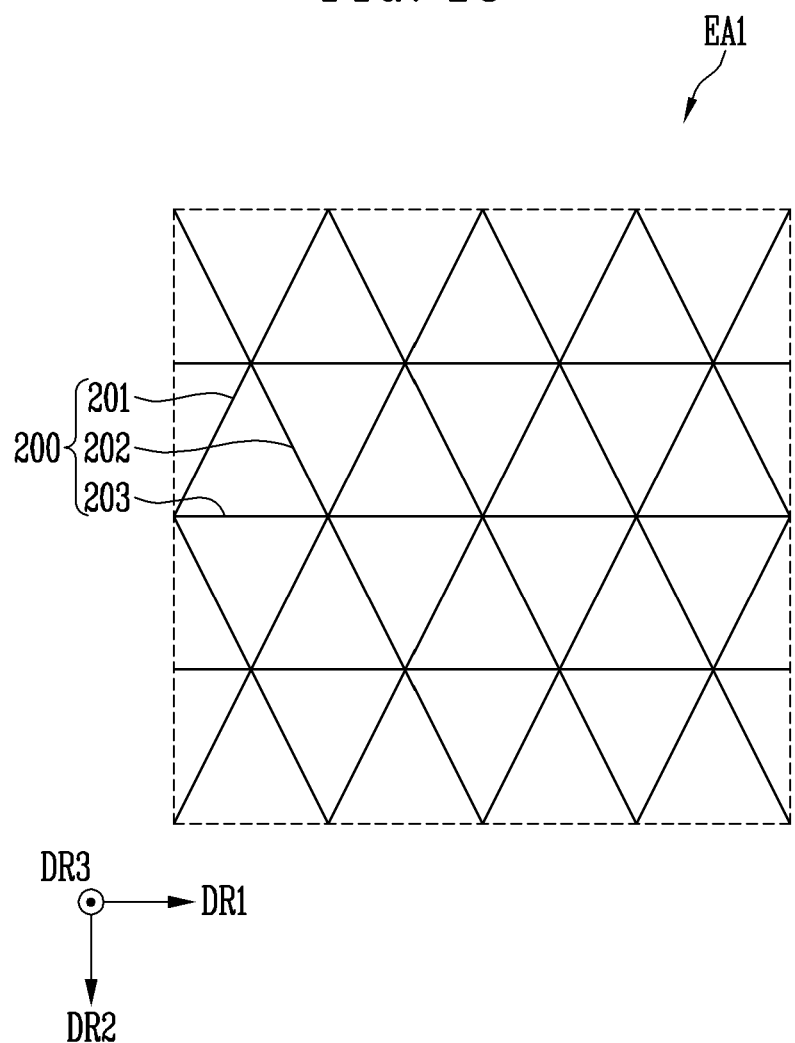

FIGS. 11 to 13 are schematic plan views illustrating shapes of the anti-electrostatic pattern in accordance with embodiments of the disclosure. FIGS. 11 to 13 are enlarged views of area EA1 shown in FIG. 2, and schematically illustrate shapes of the anti-electrostatic pattern 200 in accordance with embodiments of the disclosure.

First, referring to FIG. 11, the anti-electrostatic pattern 200 may be arranged (or patterned) in a mesh pattern having a rectangular unit shape. Since the anti-electrostatic pattern 200 including the anti-reflection pattern 240 may be arranged in the mesh pattern, reflection of external light can be prevented while performing an anti-electrostatic function, thereby improving visibility.

For example, the anti-electrostatic pattern 200 may include a first anti-electrostatic pattern 201 extending in the first direction DR1 and a second anti-electrostatic pattern 202 extending in a second direction DR2. The first anti-electrostatic pattern 201 and the second anti-electrostatic pattern 202 may intersect each other, thereby forming a rectangular unit shape. The second direction DR2 may extend in a direction intersecting (or non-parallel to) the first direction DR1.

Referring to FIG. 12, the anti-electrostatic pattern 200 may be arranged (or patterned) in a rhombic unit shape.

For example, the anti-electrostatic pattern 200 may include a first anti-electrostatic pattern 201 extending in a direction non-parallel to the first direction DR1 and a second anti-electrostatic pattern 202 extending in a direction non-parallel to the second direction DR2. The first anti-electrostatic pattern 201 and the second anti-electrostatic pattern 202 may intersect each other, thereby forming a rhombic unit shape. An arrangement position of the first anti-electrostatic pattern 201 and an arrangement position of the second anti-electrostatic pattern 202 may be appropriately selected, so that the rhombic unit pattern can be provided.

Referring to FIG. 13, the anti-electrostatic pattern 200 may be arranged (or patterned) in a triangular unit shape.

For example, the anti-electrostatic pattern 200 may include a first anti-electrostatic pattern 201, a second anti-electrostatic pattern 202, and a third anti-electrostatic pattern 203, which may extend in directions non-parallel to each other. The directions in which the first anti-electrostatic pattern 201, the second anti-electrostatic pattern 202, and the third anti-electrostatic pattern 203 respectively extend may be provided to be dislocated from each other, so that the first anti-electrostatic pattern 201, the second anti-electrostatic pattern 202, and the third anti-electrostatic pattern 203 can intersect each other. Accordingly, the triangular unit pattern can be provided.

In accordance with the disclosure, there can be provided a display device in which electrical reliability may be improved by preventing an electrostatic phenomenon, and visibility may be improved by reducing influence on external light.

Embodiments have been disclosed herein, and although specific terms may be employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims including equivalents thereof.

What is claimed is:

1. A display device comprising:
a display element part disposed on a substrate, the display element part including a light emitting element; and
an upper film layer disposed on the display element part, the upper film layer including an anti-electrostatic pattern, wherein
the anti-electrostatic pattern includes an electrostatic discharge pattern and an anti-reflection pattern disposed on the electrostatic discharge pattern, and
the electrostatic discharge pattern and the anti-reflection pattern overlap each other.

2. The display device of claim 1, wherein
the upper film layer includes an outer film, and
the anti-electrostatic pattern is disposed on the outer film.

3. The display device of claim 2, wherein the outer film includes an anti-reflective coating.

4. The display device of claim 2, wherein
the outer film is disposed on a surface of the anti-reflection pattern, and
the electrostatic discharge pattern is disposed on another surface of the anti-reflection pattern.

5. The display device of claim 2, wherein
the outer film is disposed on a surface of the electrostatic discharge pattern, and
the anti-reflection pattern is disposed on another surface of the electrostatic discharge pattern.

6. The display device of claim 2, wherein
the anti-reflection pattern includes a first anti-reflection pattern and a second anti-reflection pattern,
the first anti-reflection pattern is disposed between the outer film and the electrostatic discharge pattern,
the second anti-reflection pattern is disposed on a surface of the electrostatic discharge pattern, and
the first anti-reflection pattern is not disposed on the surface of the electrostatic discharge pattern.

7. The display device of claim 1, further comprising:
a display area from which light is emitted; and
a non-display area surrounding at least a portion of the display area,
wherein the anti-electrostatic pattern is electrically connected to a connection line disposed in the non-display area such that an electrostatic signal is moved to outside of the display area and the non-display area through the electrostatic discharge pattern.

8. The display device of claim 1, wherein the anti-electrostatic pattern has a periodically patterned shape.

9. The display device of claim 1, wherein the anti-electrostatic pattern includes:
a first anti-electrostatic pattern extending in a first direction; and
a second anti-electrostatic pattern extending in a second direction intersecting the first direction, and
a unit shape provided by the first anti-electrostatic pattern and the second anti-electrostatic pattern intersecting each other is a rectangular shape.

10. The display device of claim 1, wherein the anti-electrostatic pattern is disposed in a mesh pattern having a rhombic unit shape.

11. The display device of claim 1, wherein the anti-electrostatic pattern is disposed in a mesh pattern having a triangular unit shape.

12. The display device of claim 1, wherein the electrostatic discharge pattern includes at least one of silver (Ag), copper (Cu), nickel (Ni), and gold (Au).

13. The display device of claim 1, wherein the anti-reflection pattern incudes at least one of graphite, carbon black, black pigment, and black dye.

14. The display device of claim 13, wherein the anti-reflection pattern has a reflexibility of less than about 30%.

15. The display device of claim 1, wherein the anti-electrostatic pattern has a line width of less than about 10 µm.

16. The display device of claim 1, wherein the electrostatic discharge pattern and the anti-reflection pattern have a same shape in a plan view.

17. The display device of claim 1, further comprising:
a light control part disposed between the display element part and the upper film layer, the light control part including a wavelength conversion layer that changes a wavelength of light.

18. The display device of claim 1, wherein the light emitting element is at least one of an organic light emitting diode, a micro light emitting diode, and an inorganic light emitting diode.

19. The display device of claim 1, wherein light provided from the light emitting element passes through the upper film layer such that the light is provided to outside of the display device.

20. A display device comprising:
a display element part disposed on a substrate; and
an anti-electrostatic pattern disposed in a mesh pattern on the display element part, the anti-electrostatic pattern including:
an electrostatic discharge pattern; and
an anti-reflection pattern disposed on the electrostatic discharge pattern and having a surface in contact with the electrostatic pattern,
wherein the anti-reflection pattern has a reflexibility of less than about 30%.

21. The display device of claim 20, wherein the anti-electrostatic pattern discharges an electrostatic signal against the display device.

* * * * *